(12) United States Patent
Lee et al.

(10) Patent No.: US 7,084,664 B1
(45) Date of Patent: Aug. 1, 2006

(54) INTEGRATED CIRCUITS WITH REDUCED INTERCONNECT OVERHEAD

(75) Inventors: Kwan Yee Lee, Hayward, CA (US); Martin Langhammer, Salisbury (GB); Ali H. Burney, Fremont, CA (US)

(73) Assignee: Alter Corporation, San Jose, CA (US)

( * ) Notice: Subject to any disclaimer, the term of this patent is extended or adjusted under 35 U.S.C. 154(b) by 10 days.

(21) Appl. No.: 10/867,456

(22) Filed: Jun. 14, 2004

(51) Int. Cl.
*G06F 7/38* (2006.01)
*H03K 19/173* (2006.01)
*H04Q 7/00* (2006.01)
*H04Q 7/28* (2006.01)

(52) U.S. Cl. .......................... 326/38; 326/39; 370/58.1; 370/77; 370/314; 370/341

(58) Field of Classification Search ............ 326/38–39; 716/16; 370/314, 341, 58.1, 77
See application file for complete search history.

(56) References Cited

U.S. PATENT DOCUMENTS

| | | | |
|---|---|---|---|
| 5,583,450 A | 12/1996 | Trimberger et al. | |
| 5,594,367 A | 1/1997 | Trimberger et al. | |
| 5,600,263 A | 2/1997 | Trimberger et al. | |
| 5,629,637 A | 5/1997 | Trimberger et al. | |
| 5,646,545 A | 7/1997 | Trimberger et al. | |
| 5,701,441 A | 12/1997 | Trimberger | |
| 5,740,404 A * | 4/1998 | Baji | 711/167 |
| 5,761,483 A | 6/1998 | Trimberger | |
| 5,825,662 A | 10/1998 | Trimberger | |
| 5,838,954 A | 11/1998 | Trimberger | |
| 5,978,260 A | 11/1999 | Trimberger et al. | |
| 5,986,467 A | 11/1999 | Trimberger | |
| 6,263,430 B1 | 7/2001 | Trimberger et al. | |
| 6,272,130 B1 * | 8/2001 | Panahi et al. | 370/366 |
| 6,307,658 B1 * | 10/2001 | Chiaroni et al. | 398/183 |
| 6,480,954 B1 | 11/2002 | Trimberger et al. | |
| 6,501,296 B1 * | 12/2002 | Wittig et al. | 326/39 |
| 6,684,275 B1 * | 1/2004 | Goldstein | 710/71 |

* cited by examiner

*Primary Examiner*—Rexford Barnie
*Assistant Examiner*—Jason Crawford
(74) *Attorney, Agent, or Firm*—G. Victor Treyz

(57) ABSTRACT

Integrated circuits are provided that use on-chip data compression and decompression to minimize consumption of interconnect resources. Parallel-to-serial converter circuitry can use time-division multiplexing techniques to compress data. The compressed data may be conveyed between circuit blocks on the integrated circuit using a reduced number of parallel interconnect conductors. After the compressed data has been conveyed to its destination, a serial-to-parallel converter may use time-division demultiplexing techniques to decompress the data. Interconnect resources may be shared by dedicated circuits. With this arrangement, signals can be selectively steered through the appropriate dedicated circuitry to either maximize performance or to use compression and decompression to minimize interconnect resource consumption.

20 Claims, 6 Drawing Sheets

INTEGRATED CIRCUITS WITH REDUCED INTERCONNECT OVERHEAD

BACKGROUND OF THE INVENTION

This invention relates to integrated circuits such as programmable logic device integrated circuits, and more particularly, to circuitry that compresses parallel data into a more serialized format to reduce the overhead associated with providing large numbers of parallel interconnect lines when conveying data across a chip.

Integrated circuits such as programmable logic devices typically contain logic resources whose operation can be programmed using configuration data. A user can customize a programmable logic device to perform a desired logic function by loading appropriate configuration data into the device. The programmable resources on a programmable logic device can be used to implement memory and digital signal processing functions. However, using general-purpose programmable resources to implement complex memory or digital signal processing circuits can be inefficient. As an example, implementing an 18-bit×18-bit multiplier using general-purpose programmable logic resources may consume ten times more circuit real estate than implementing the same type of multiplier using a dedicated multiplier circuit.

As integrated circuit dimensions shrink due to advances in process technology, the sizes of the transistors on a circuit often scale more rapidly than the sizes of the interconnect conductors used to transport signals between different locations on the circuit. This trend makes it increasingly important to minimize the amount of circuit resources used for forming interconnects.

Dedicated circuits such as digital signal processing circuits and memory often have large numbers of associated inputs and outputs. For example, a true dual-port 18-bit memory has 36 input data lines and 36 output data lines. An 18 bit multiplier has 36 data input lines and 36 data output lines. Additional lines are needed for clock signals and control signals.

When large groups of interconnect lines such as the interconnect lines traditionally associated with memory and signal processing circuit blocks extend across a significant portion of an integrated circuit, a correspondingly large portion of the interconnect resources of the integrated circuit are consumed and are therefore not available to support other signal routing tasks.

It would be desirable to be able to provide ways in which to minimize interconnect resource consumption on integrated circuits such as programmable logic devices.

SUMMARY OF THE INVENTION

In accordance with the present invention, integrated circuits are provided that contain data compression and decompression circuitry. The compression and decompression circuitry can be used to minimize the amount of interconnect resources that are used to convey signals across the integrated circuits.

The integrated circuits may be programmable logic device integrated circuits containing programmable logic. A logic designer may customize the programmable logic using configuration data. At least some of the compression and decompression circuitry can be formed using programmable logic. For example, when it is desired to minimize interconnect resource consumption between a region of programmable logic that generates data signals and a dedicated hardwired circuit, a portion of the programmable logic can be configured to form a programmable logic parallel-to-serial converter.

Parallel data signals from the region of programmable logic can be compressed by the programmable logic parallel-to-serial converter using time-division multiplexing. This reduces the number of parallel interconnect lines needed to carry the data. After the compressed data has been conveyed to its destination at the dedicated hardwired circuit, a dedicated hardwired serial-to-parallel converter can use time-division demultiplexing techniques to decompress the compressed data. The uncompressed version of the data may be provided to the dedicated hardwired circuit.

Data compression and decompression can also be used to minimize consumption of interconnect resources that are used to convey data from the dedicated hardwired circuit to other logic. For example, a dedicated hardwired parallel-to-serial converter circuit can use time-division multiplexing to compress data signals (e.g., data signals that have been processed by digital signal processing circuitry in the dedicated hardwired circuit). These compressed data signals can be conveyed across an integrated circuit using a reduced number of parallel interconnect lines. A programmable logic serial-to-parallel converter that is formed from user-configured programmable logic can use time-division demultiplexing techniques to decompress the data that was compressed using the hardwired parallel-to-serial converter.

If desired, switching circuitry such as multiplexers whose connections can be customized using user-defined configuration data stored in on-chip programmable elements can be used to steer data signals on the integrated circuit. Data signal steering may be used to allow first and second dedicated hardwired circuits to share interconnection resources. For example, a hardwired memory circuit and a hardwired digital signal processing circuit can share interconnect resources.

The switching circuitry and programmable logic on the integrated circuit can be configured to support at least three modes of operation for each set of first and second dedicated hardwired circuits.

In a first mode of operation, interconnection resources are dedicated to serving the first dedicated hardwired circuit. Compression and decompression of data is not needed, so the programmable logic need not be used to form the programmable logic parallel-to-serial converter and can therefore be used for other programmable logic functions.

In the first mode of operation, the switching circuitry is configured to steer incoming and outgoing data through the first dedicated circuit but not through the second dedicated circuit. All of the interconnect resources that are associated with the first and second dedicated circuits are therefore available for use by the first dedicated circuit. The first dedicated circuit can therefore operate to its maximum potential in the first mode of operation.

In the second mode of operation, the first and second dedicated hardwired circuits actively share interconnect resources. The programmable logic can be used to implement a programmable parallel-to-serial converter that compresses incoming data using time-division multiplexing. Data compression allows fewer interconnect resources to be used to convey the data to the hardwired circuits. A hardwired serial-to-parallel converter can be used to decompress the compressed data. The decompressed incoming data can be used by the second dedicated hardwired circuit. The first dedicated hardwired circuit can receive incoming data over a portion of the interconnect resources that do not use data compression and decompression.

During the second mode of operation, the first dedicated hardwired circuit can produce output data signals for other circuitry on the integrated circuit. These output signals can be conveyed across the integrated circuit using a portion of the interconnect resources. The data produced by the second dedicated hardwired circuit can be compressed using a hardwired parallel-to-serial converter. Compressed data from the hardwired parallel-to-serial converter can be conveyed over a portion of the interconnects. A serial-to-parallel converter implemented using a portion of the integrated circuit's programmable logic resources can be used to decompress the compressed data. In the second mode of operation, the first and second dedicated hardwired circuits are both used, although with somewhat reduced capacity because they are actively sharing limited interconnect resources.

In the third mode of operation, the switching circuitry and programmable logic are configured so that interconnection resources are allocated to serving the second dedicated hardwired circuit. The programmable logic for the programmable logic parallel-to-serial converter need not be used to form the programmable logic parallel-to-serial converter and can therefore be used for other programmable logic functions. All of the interconnect resources associated with the first and second dedicated hardwired circuit are available to serve the second dedicated hardwired circuit, so the second dedicated hardwired circuit can operate at its maximum possible performance level.

Further features of the invention, its nature and various advantages will be more apparent from the accompanying drawings and the following detailed description of the preferred embodiments.

DETAILED DESCRIPTION OF THE PREFERRED EMBODIMENTS

The present invention relates to circuit arrangements that may be used to minimize the consumption of interconnect resources on an integrated circuit and thereby lower circuit cost while maintaining desired levels of performance. The invention applies to any suitable integrated circuits. For clarity, the present invention will sometimes be described in the context of programmable logic device integrated circuits. This is, however, merely illustrative.

Figure 1:
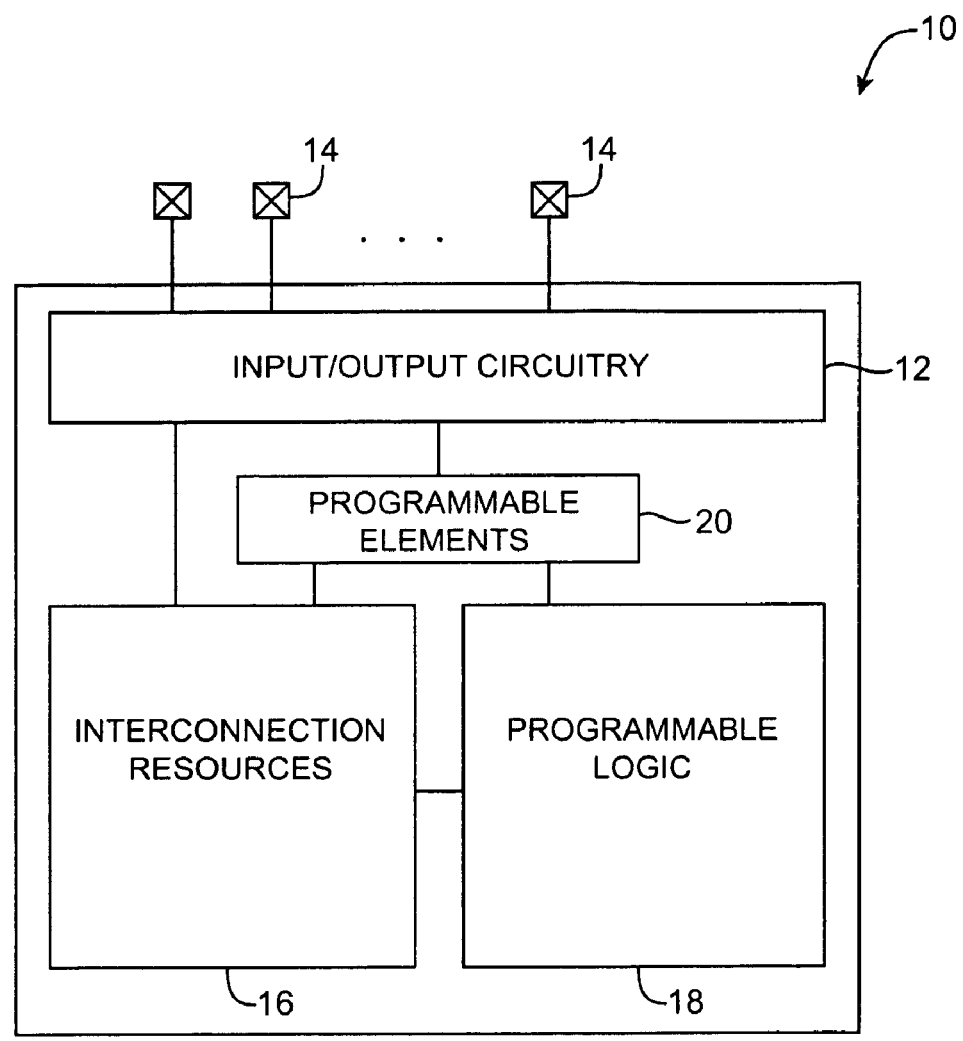
FIG. 1 is a schematic diagram of an illustrative programmable logic device integrated circuit in accordance with the present invention.

An illustrative programmable logic device 10 in accordance with the present invention is shown in FIG. 1.

Programmable logic device 10 may have input/output circuitry 12 for driving signals off of device 10 and for receiving signals from other devices via input/output pins 14. Interconnection resources 16 such as vertical and horizontal conductive lines may be used to route signals on device 10. Programmable logic 18 may include combinational and sequential logic circuitry. The programmable logic 18 may be configured to perform a custom logic function.

Programmable logic device 10 may be based on any suitable programmable technology. With one suitable approach, configuration data (also called programming data) may be loaded into programmable elements 20 using pins 14 and input/output circuitry 12. The programmable elements (also sometimes called configuration bits or programmable function control elements) may each provide a static control output signal that controls the state of an associated logic component in programmable logic 18.

As an example, the programmable elements 20 may be random-access memory (RAM) cells that are loaded from an external erasable-programmable read-only memory chip via pins 14 and input/output circuitry 12. The loaded RAM cells 20 provide static control signals that are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors or parts of multiplexers, look-up tables, logic arrays, AND, OR, NAND, and NOR logic gates, etc.

RAM-based programmable logic device technology is merely one illustrative example of the type of technology that may be used to implement programmable logic device 10. Other suitable programmable logic device technologies that may be used for device 10 include one-time programmable device arrangements such as those based on programmable logic elements made from fuses or antifuses, programmable logic devices in which elements 20 are formed from electrically-programmable read-only-memory (EPROM) or erasable-electrically-programmable read-only-memory (EEPROM) technology, or programmable logic devices with programmable elements made from magnetic storage elements, etc.

Regardless of the particular type of programmable element arrangement that is used for device 10, programmable elements are preferably provided with configuration data by a user (e.g., a logic designer). Once provided with configuration data, the programmable elements 20 selectively control (e.g., turn on and off) portions of the circuitry in the programmable logic 18 and thereby customize its functions so that it will operate as desired.

The circuitry on device 10 may be controlled using signals from external sources (e.g., control signals received from other integrated circuits via input/output circuitry 12) or signals from internal circuitry such as programmable elements 20 and programmable logic 18. The signals from programmable elements 20 generally do not change once device 10 has been programmed, so these signals may be referred to as static signals. The signals from programmable logic 18 generally change in real time during the operation of programmable logic device 10, so these signals may be referred to as dynamic signals.

Figure 2:
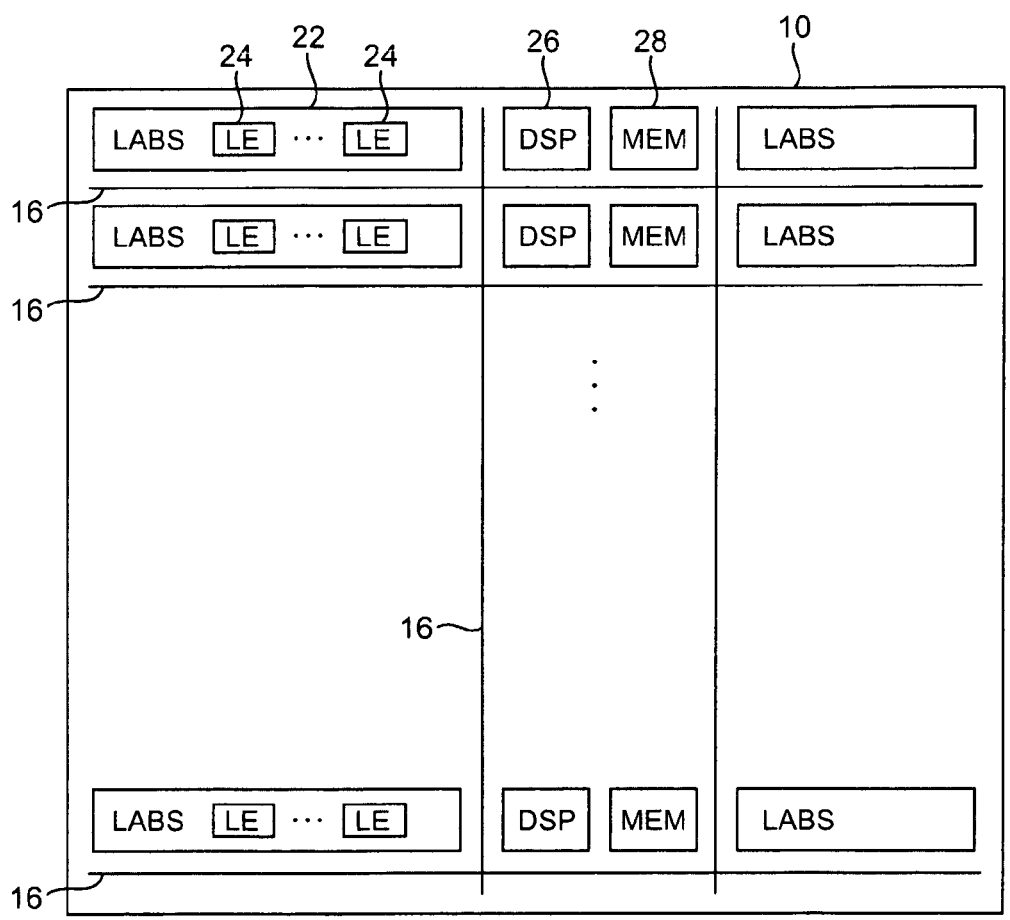
FIG. 2 is a schematic diagram of an illustrative programmable logic device integrated circuit in accordance with the present invention showing how programmable logic and dedicated circuits such as digital signal processing circuits and memory circuits may be provided using rows and columns of circuitry.

The circuitry of device 10 may be organized using any suitable architecture. As an example, the logic of programmable logic device 10 may be organized in a series of rows and columns of one or more larger, programmable logic regions or areas 22 (sometimes referred to as logic array blocks or LABs) each of which contains multiple smaller logic regions or areas 24 (sometimes referred to as logic elements or LEs) as shown in FIG. 2. These logic resources may be interconnected by interconnection resources 16 such as associated vertical and horizontal conductors. The interconnection conductors 16 may include global conductive lines that span substantially all of device 10, fractional lines such as half-lines or quarter lines that span a substantial part of device 10, staggered lines of a particular length (e.g., sufficient to interconnect several logic areas), smaller local lines that interconnect logic regions 24 with other logic regions 24 in a given area 22, or any other suitable interconnection resource arrangement. Multiplexers and other suitable circuits may be used to interconnect vertical and horizontal conductors to form various user-selected signal paths throughout device 10. If desired, the logic of device 10 may be arranged in more levels or layers in which multiple large areas 22 are interconnected to form still larger portions of logic. Still other device arrangements may use logic that is not arranged in rows and columns.

The programmable logic (e.g., the logic of logic elements 24) may be based on look-up tables (LUTs) or any other suitable configurable logic circuits. Logic elements 24 may contain register logic for selectively registering data signals.

To perform certain functions efficiently, dedicated circuits such as digital signal processing circuits 26 and memory circuits 28 may be provided on circuit 10. With one illustrative arrangement, a digital signal processing circuit such as a multiplier and a memory circuit such as a true dual-port memory may be provided in each row of programmable logic device 10. There may be (as an example) 10 rows of circuitry in device 10, each of which contains 10s of logic regions 22 and at least one digital signal processing circuit 26 and memory 28.

Dedicated circuits (sometimes called hardwired circuits even though they may have modest capabilities for being programmed or reconfigured by a user) are more efficient than general-purpose programmable logic resources such as the programmable look-up tables and registers of logic elements 24 for performing certain tasks. For example, a dedicated memory circuit can generally store much larger amounts of data and can store this data much more efficiently than a collection of registers in the programmable logic. Similarly, a digital signal processing circuit such as a dedicated hardwired 18-bit multiplier can perform multiplication functions using a much smaller circuit area (e.g., about ten times less) than would be possible using user-configured general-purpose logic resources such as the resources of logic regions 22 and logic subregions 24.

Digital signal processing circuit 26 may be, for example, circuitry that includes one or more multipliers, accumulators, adders, counters, barrel shifters, etc. Memory circuit 28 may be, for example, an 18-bit true dual-port memory. The dedicated circuits such as digital-signal-processor (DSP) circuits 26 and memory circuits 28 may be located in a central column of programmable logic device 10 to facilitate communication with logic circuitry 22 on either side of device 10 or may be placed in any other suitable location. More than one block of dedicated circuitry may be placed in each row if desired.

In general, dedicated circuits such as circuits 26 and 28 may have near-unity ratios of fan-in to fan-out. Circuits such as circuits 26 and 28 also generally handle relatively large vectors as input signals (i.e., these circuits receive multiple data signals in parallel such as the data signals in an 18-bit word). In one suitable arrangement, a digital signal processing circuit may have a fan-in-to-fan-out ratio of about 1:1 and may have 10s of parallel input lines. A memory circuit, which has address and data lines as inputs and which has output data lines, may also have 10s of input lines and may have a fan-in-to-fan-out ratio of about 1.5:1 (which is still near unity). In comparison, a logic element 24 that is based on a four-input look-up table may have a fan-in-to-fan-out ratio of about 4:1. To use resources efficiently, it is important to minimize the interconnect resources that are used to convey signals between areas of the programmable logic device 10 and the dedicated circuits. This is particularly the case when programmable logic device 10 has dedicated circuitry that places large demands on interconnection resources such as circuits 26 and 28 that have near unity ratios of fan-in-to-fan-out and that handle large numbers of parallel data signals.

The present invention uses data compression techniques to reduce the number of interconnect lines that are used to convey data between different locations on an integrated circuit. In a programmable logic device environment, for example, data from programmable logic can be compressed using a parallel-to-serial converter. The serialized data can be routed to dedicated circuitry (e.g., a multiplier or other digital signal processing circuitry and/or memory) over a reduced number of vertical and/or horizontal conductors on the device. At the dedicated circuitry, a serial-to-parallel converter can be used to decompress the data for processing by the dedicated circuitry. The processed data can also be compressed before transmission to suitable programmable logic elsewhere on the circuit. Because the number of interconnect lines and other interconnect resources used to convey the serialized (compressed) data is reduced relative to that of an unserialized arrangement, use of the compression and decompression circuitry can significantly reduce interconnect resource consumption on the integrated circuit.

Figure 3:
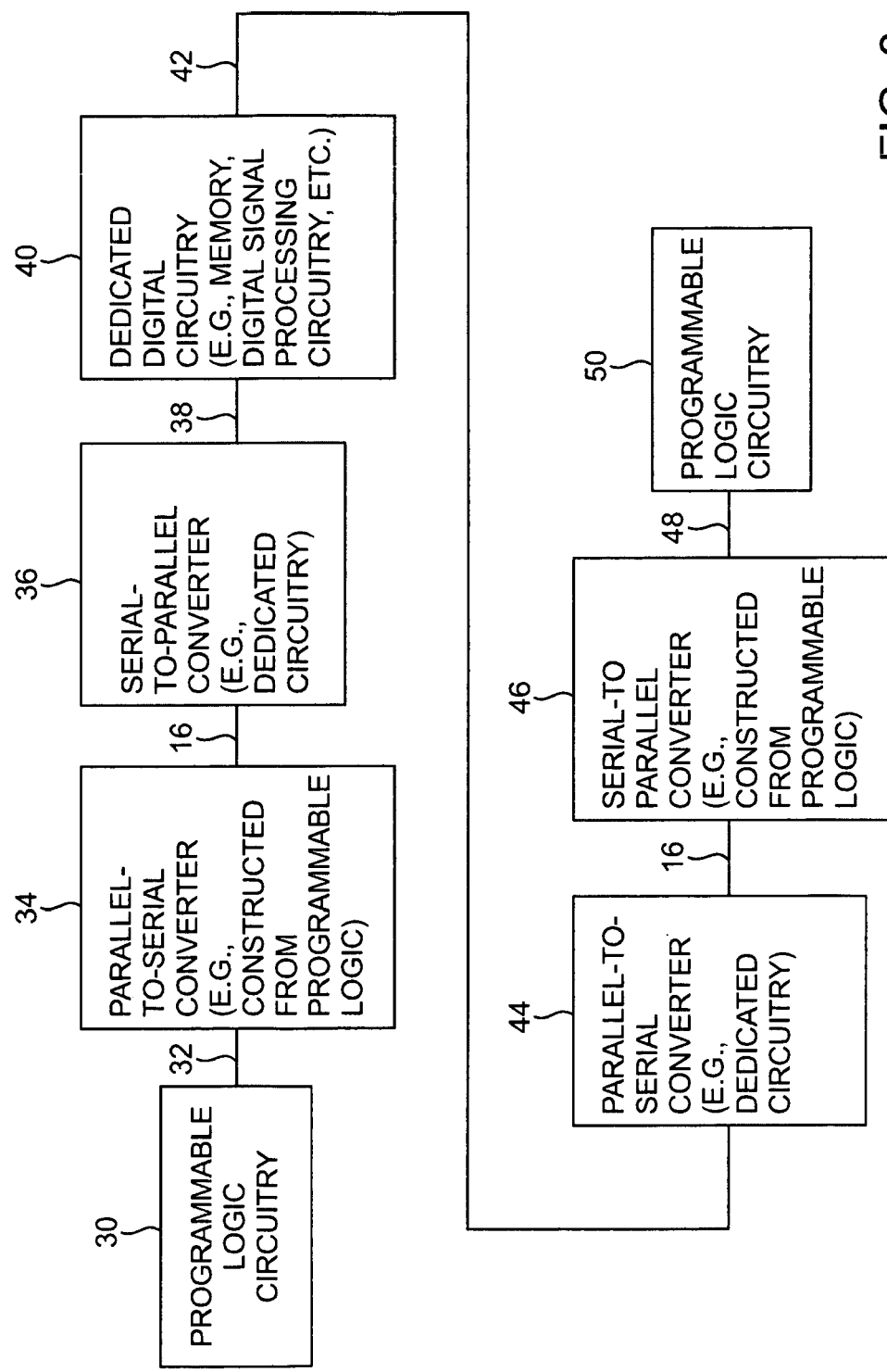
FIG. 3 is a schematic diagram showing how parallel-to-serial converters and serial-to-parallel converters may be used to minimize interconnect resource consumption in accordance with the present invention.

An illustrative portion of a programmable logic device integrated circuit that uses a data compression/decompression arrangement of this type is shown in FIG. 3.

In the example of FIG. 3, data is generated by a portion of programmable logic circuitry 30. As an example, data may be generated by sequential and/or combinational logic constructed from user-programmed look-up table and register logic. If the programmable logic device of which programmable logic circuitry 30 is a part has a structure of the type shown in FIG. 2, the programmable logic circuitry may be formed from one or more logic regions 22 and/or 24.

The data from programmable logic circuitry 30 is provided on parallel data lines 32. The number of lines 32 that are used in parallel at the output of programmable logic circuitry 30 depends on the particular type of programmable logic circuitry involved. As an example, the programmable logic circuitry 30 may produce data on 36 data lines 32.

The signals on these 36 conductors are serialized (compressed) using parallel-to-serial converter circuitry 34. Such a parallel-to-serial converter 34 (sometimes also called a multiplexer or data compressor) feeds data from multiple parallel lines to a reduced number of one or more parallel lines. As an example, the data from 36 conductors 32 may be time-division multiplexed using parallel-to-serial converter 34 so that it can be conveyed over 18 vertical and/or horizontal lines in interconnection resources 16. In a conventional (uncompressed) arrangement, the parallel-to-serial conversion process would not take place, so that 36 interconnect conductors would be required to convey this data across the device. In the present situation, in contrast, only 18 interconnect lines 16 are needed.

Parallel-to-serial converters such as parallel-to-serial converter 34 of FIG. 3 may be constructed using hardwired (e.g., substantially non-programmable) circuits or by user-programmed programmable logic 18 (FIG. 1) (e.g., programmable logic such as the logic of regions 22 and/or 24 of FIG. 2). An advantage of using programmable logic to form parallel-to-serial converters such as converter 34 is that when the capabilities of the dedicated circuitry (e.g., the DSP or memory circuitry) on the device are not used or do not use compressed data and the parallel-to-serial converters are therefore not needed, the logic resources that might otherwise be used for the parallel-to-serial converters can be returned to the pool of general logic resources available to the user for implementing a desired logic function.

The data that was compressed using the time-division multiplexing capabilities of parallel-to-serial converter 34 may be decompressed (i.e., deserialized or demultiplexed) using serial-to-parallel converter circuitry 36. Serial-to-parallel converter circuitry 36 may be formed from programmable logic 18 (FIG. 1) (e.g., by allowing the user to program the logic regions 22 and/or 24) or may be formed using dedicated hardwired circuitry. An advantage of using a hardwired serial-to-parallel converter 36 is that it requires fewer resources to implement (e.g., fewer transistors) than a serial-to-parallel converter formed from programmable logic.

Serial-to-parallel converter 36 decompresses the serialized data received on interconnect lines 16. In the present example, the data from the 18 parallel interconnects 16 is deserialized and placed on 36 associated parallel conductors 38.

Serial-to-parallel converters such as serial-to-parallel converter 36 may be formed adjacent to and as part of dedicated digital circuitry 40, to minimize the length of conductors 38 and thereby conserve real estate on device 10.

Dedicated circuitry 40 may include dedicated hardwired circuitry (e.g., non-programmable or nearly non-programmable circuitry that is used for a particular purpose such as a dedicated multiplier, a dedicated accumulator, a dedicated adder, a dedicated memory, etc.)

After the parallel data signals that are provided on lines 38 are processed by dedicated circuitry 40, a corresponding set of parallel output signals are provided on parallel output lines 42. In the current example, there are 36 input lines 38 and 36 corresponding parallel output lines 42.

To minimize the consumption of interconnect resources, the data on the 36 parallel output lines 42 may be compressed using time-division multiplexing (i.e., by serializing the data using parallel-to-serial converter 44). Converter 44 may be formed from user-programmed programmable logic or from dedicated hardwired circuitry. The use of dedicated circuitry to form parallel-to-serial converter 44 may be advantageous in that this circuitry consumes less real estate on device 10 than circuitry formed from programmable logic.

After the parallel output signals from dedicated digital circuitry 40 have been serialized (e.g., to reduce the number of signal lines carrying this data from 36 to 18 lines in this example), the signals may be conveyed over interconnects 16 (e.g., 18 parallel horizontal and/or vertical interconnect conductors from the general interconnection resources 16 of device 10) to programmable logic circuitry elsewhere on the device such as programmable logic circuitry 50. Before the serialized signals are provided to programmable logic circuitry 50, these signals may be deserialized using a serial-to-parallel converter such as serial-to-parallel converter 46. Converter 46 (like converter 36) may time-demultiplex the data on lines 16 and provide corresponding deserialized data to programmable logic circuitry 50 over lines 48.

To minimize the real estate consumed by lines 48, lines 48 may be relatively short local lines and serial-to-parallel converter 46 may be formed adjacent to programmable logic circuitry 50. Serial-to-parallel converter 46 may be formed from dedicated hardwired circuits or may be a programmable logic serial-to-parallel converter formed by a user from programmable logic resources. An advantage of using programmable resources to form serial-to-parallel converter 46 is that these resources can be used to implement other desired functions when the decompression capabilities of the serial-to-parallel converter are not being used in a particular design.

Although the illustrative arrangement of FIG. 3 uses data compression and decompression on both the input and output sides of dedicated digital circuitry 40, this is merely illustrative. Data compression may, if desired, be only used on the input side (e.g., between the outputs of circuitry such as programmable logic circuitry 30 and the input of digital circuitry such as dedicated digital circuitry 40) or may only be used on the output side (e.g., between the outputs of digital circuitry such as hardwired circuitry 40 and the inputs of circuitry such as programmable logic circuitry).

The arrangement of FIG. 3 involves the use of additional circuitry such as parallel-to-serial and serial-to-parallel converters to support data compression and decompression functions just before and after data is transmitted over sections of interconnect 16. The overhead associated with using compression and decompression circuitry on device 10 is offset by the resulting savings in interconnect resource overhead. The overall reduction in overhead that can be achieved is particularly great when significant lengths of interconnects 16 are involved. For example, when a particular logic design requires that data be conveyed from programmable logic in the first row of the device to a dedicated multiplier in the last row (e.g., the tenth row) of a device, the interconnects 16 used to convey this data span 10 rows of the device and therefore occupy a substantial portion of the device area. By reducing the number of interconnect lines (e.g., by a factor of 2, by a factor of 4, etc.), the area consumed by the interconnects is reduced. The device 10 can therefore be constructed with fewer interconnect lines and correspondingly increased amounts of logic circuitry can be provided in the available real estate on the circuit or more data can be conveyed over a fixed number of interconnect lines.

The parallel-to-serial converters such as converters 34 and 44 can be N:1 converters, where N is 2, 3, 4, or any other suitable number. The serial-to-parallel converters such as converters 36 and 46 can be 1:N converters, where N is 2, 3, 4, or any other suitable number. As an example, the parallel-to-serial converters may be 2:1 converters and the serial-to-parallel converters may be 1:2 converters.

The parallel-to-serial converters and serial-to-parallel converters may or may not include registers. If register logic is used in the converters, signals may be registered (e.g., temporarily buffered by passing through a register). Such registers may also be selectively bypassed by users. For example, with one suitable arrangement, parallel-to-serial converter 34 is constructed from user-configured programmable logic 18 containing registers. The user can configure the programmable logic in the parallel-to-serial converters to bypass undesired registers. Similarly, the serial-to-parallel converter 46 may be constructed from register logic and programmable logic. A user can either bypass the registers or include the registers in the data path by appropriate programming of the logic (e.g., by loading appropriate configuration data into the device 10).

Figure 4:
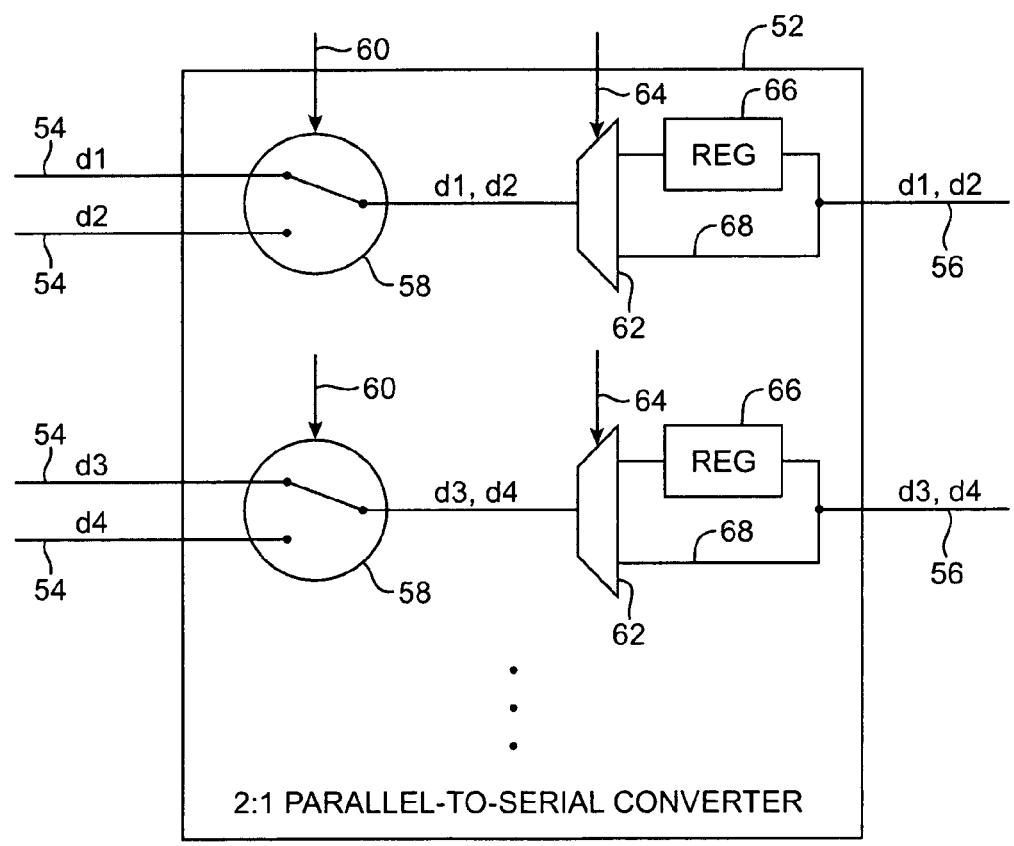
FIG. 4 is a circuit diagram of an illustrative parallel-to-serial converter with bypassable register logic in accordance with the present invention.

An illustrative parallel-to-serial converter 52 is shown in FIG. 4. Converter 52 of FIG. 4 is a 2:1 converter (as an example). Input data is provided on parallel input lines 54. Corresponding output data that has been serialized by the parallel-to-serial converter is placed on output lines 56. Converter 52 has a number of switches 58, which are controlled by control signals (clocks) on control lines 60. Under the control of these control signals, switches 58 alternately connect either their upper or their lower inputs to their outputs. As shown in FIG. 4, this results in the combining of parallel data (e.g., signal d1 on the upper input data line 54 and the signal d2 on the lower input data line in the top of FIG. 4) onto a smaller number of output lines (e.g., so signals d1 and d2 are time multiplexed onto a single corresponding output line 56 at the top of FIG. 4).

When converters have register logic, multiplexers 62 may be used to selectively include or bypass the register logic. As shown in FIG. 4, for example, multiplexers 62 may be controlled by control signals provided via control lines 64. When the control signals have one value, the input of a given multiplexer 62 is routed to its upper output, so that data is routed through a corresponding register 66 before passing to an associated output line 56. When the control signals have another value, the input of the given multiplexer 62 is routed to its lower output, so that data is routed through an unregistered path 68 before passing to the associated output line 56.

The converter 52 of FIG. 4 may be used (for example) as converter 34 or converter 44 (preferably without register logic) of FIG. 3.

The converter 52 uses switches 58 to time multiplex data from a greater number of input lines 54 onto a reduced number of output lines 56 and is therefore sometimes referred to as a data compressor or multiplexer. Serial-to-parallel converters work the same way, except that in serial-to-parallel conversion data passes through the switches 58 in the opposite direction. As a result, in serial-to-parallel converters, time-multiplexed serial data is presented at the single input of each switch 58 and is directed in a time-alternating fashion to that switch's two or more switch outputs.

The converter arrangement of FIG. 4 is merely illustrative. Any other suitable arrangement may be used for a parallel-to-serial and serial-to-parallel conversion. For example, register logic such as the registers 66 of FIG. 4 and the associated bypass circuitry are optional.

Data compression and decompression arrangements using on-chip parallel-to-serial and serial-to-parallel converters may be used in any integrated circuit arrangement in which it is desired to minimize interconnect resource consumption. In one suitable arrangement, the integrated circuit is a programmable logic device and the dedicated hardwired circuitry 40 includes a multiplier.

Figure 5:
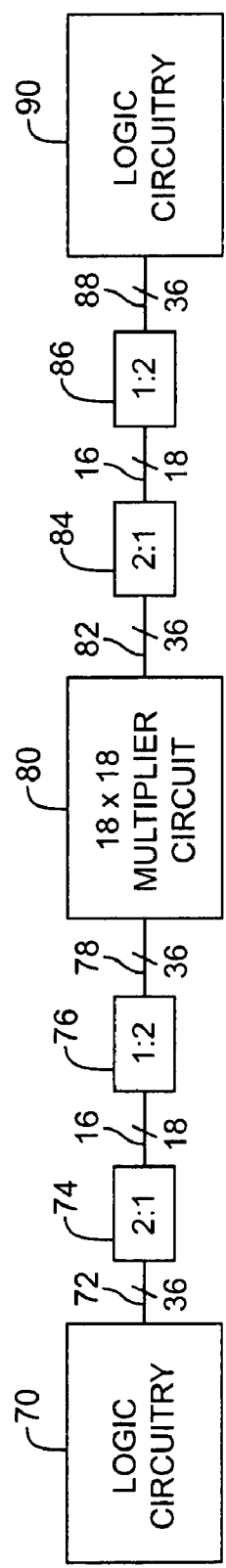
FIG. 5 is a diagram showing how parallel-to-serial and serial-to-parallel converters may be used to route signals to and from an 18×18 multiplier circuit in accordance with the present invention.

This type of arrangement is shown in FIG. 5. As shown in FIG. 5, data may be generated by logic circuitry 70. Circuitry 70 may be, for example, programmable logic circuitry whose operation is configured by a user.

There may be 36 parallel data outputs 72 associated with circuitry 70. These 36 parallel outputs may be routed on 36 parallel lines (e.g., short local lines) to 2:1 parallel-to-serial converter 74. Converter 74 may compress the data on the 36 lines 72 using time-division multiplexing, so that the signals from lines 72 can be conveyed over half the number of interconnect lines 16 (i.e., over 18 parallel interconnect lines 16). The interconnects lines may be formed using global lines or other interconnect lines and may span a significant portion of the device.

The serialized data signals on the interconnects 16 are conveyed from the logic circuitry 70 to the 18×18 multiplier circuit 80 via interconnect lines 16. When the signals arrive at the multiplier 80, they are deserialized using 1:2 serial-to-parallel converter 76. Converter 76 may, for example, use time-division demultiplexing techniques to convert the 18 lines of parallel data on interconnects 16 into 36 lines of parallel data on 36 short local parallel lines 78.

Multiplier 80 may be an 18-bit×18-bit multiplier that is hardwired to perform multiplication operations. If desired, multiplier 80 may be configured as multiple 9-bit×9-bit multipliers or as an 18-bit×18-bit multiplier by the user. The multiplier processes incoming data signals to produce 36 bits of processed data signals.

The 36-bit result of the 18-bit×18-bit multiplication operation performed multiplier 80 is provided on 36 parallel short local output lines 82. A nearby 2:1 parallel-to-serial converter 84 uses time-division multiplexing to direct the 36 parallel data signals from lines 82 onto 16 associated interconnect lines 16.

The interconnect lines 16 are used to transport the output data from the multiplier 80 to the appropriate logic circuitry 90 on the device that is to use this output data. The interconnect lines may, for example, include global (or partially-global) vertical and/or horizontal interconnects.

At the logic circuitry 90, a 1:2 serial-to-parallel converter 86 may be used to place the 18 lines of serialized data on 36 corresponding data lines 88 (e.g., short local lines) that are connected to logic circuitry 90.

The converters 74 and 86 may be formed from programmable logic and may include bypassable registers (as an example). The converters 76 and 84 may be (for example) dedicated hardwired converters.

The interconnects 16 on a given type of integrated circuit can only support a given maximum data rate. This data rate or frequency is dictated by the type of semiconductor fabrication process that is used to manufacture the integrated circuit and the resulting electrical characteristics of the interconnect conductors. Factors that can influence the maximum data rate supported by a given conductor include its impedance and its position on the integrated circuit relative to other lines and various circuit blocks.

The maximum frequency of signal that can pass through interconnects 16 limits the data rate for the serialized (time-multiplexed/compressed) data passing through the interconnects between the respective converters. This in turn affects the maximum frequency at which upstream circuits such as logic circuitry 70 and downstream circuits such as logic circuitry 90 can operate. The interconnects may have a maximum operating frequency of $f_{INTERCONNECT}$ and the parallel-to-serial converter just upstream of the interconnects may have a compression ratio of N (e.g., N=2, so that the data from 36 lines of data can be carried on 18 interconnect lines). In this situation, the maximum frequency of operation of logic circuitry 70 and dedicated circuitry such as multiplier 80 will be $f_{INTERCONNECT}/N$ (i.e., one-half of the maximum frequency that would be possible if a full complement of interconnect lines were used without data compression). The use of data compression to compress interconnect data may therefore impose speed limitations on portions of the integrated circuit's circuitry.

To address these speed limitations, routing resources associated with one type of dedicated circuit such as a true dual-port memory can be shared with another type of dedicated circuit such as a multiplier. Switching circuitry can be used to selectively steer signals through the dedicated circuitry.

When data compression is used, the memory and multiplier portions of the dedicated circuitry may each receive half of the interconnects and may therefore be operated at a somewhat reduced capacity relative to their maximum potential. The memory may, for example, operate only as a simple dual-port memory rather than as a true dual-port memory and the multiplier may operate only at half of its maximum possible speed (i.e., it may operate at $f_{INTERCONNECT}/2$).

When data compression is not used, the interconnect resources can either be allocated entirely to one type of circuit (e.g., to the memory) or to the other type of circuit (e.g., to the multiplier). Because in this situation the memory or multiplier is provided with a full complement of interconnects, it need not operate with reduced functionality or at a reduced operating speed. For example, when the interconnects that would otherwise be associated with the memory are allocated to the multiplier, the multiplier need not operate at the reduced speed of $f_{INTERCONNECT}/2$, but rather can operate at the maximum frequency $f_{INTERCONNECT}$ that is permitted by the interconnects.

In general, any two dedicated circuits (or three or more dedicated circuits or circuits that include programmable logic) may share interconnect resources. For clarity, the principles of the interconnect resource sharing scheme of the present invention will be described primarily in the context of dedicated circuitry that has a dual-port memory circuit and a multiplier circuit. This is, however, merely one illustrative arrangement that may be used. Any suitable circuits may share interconnect resources if desired.

Figure 6:
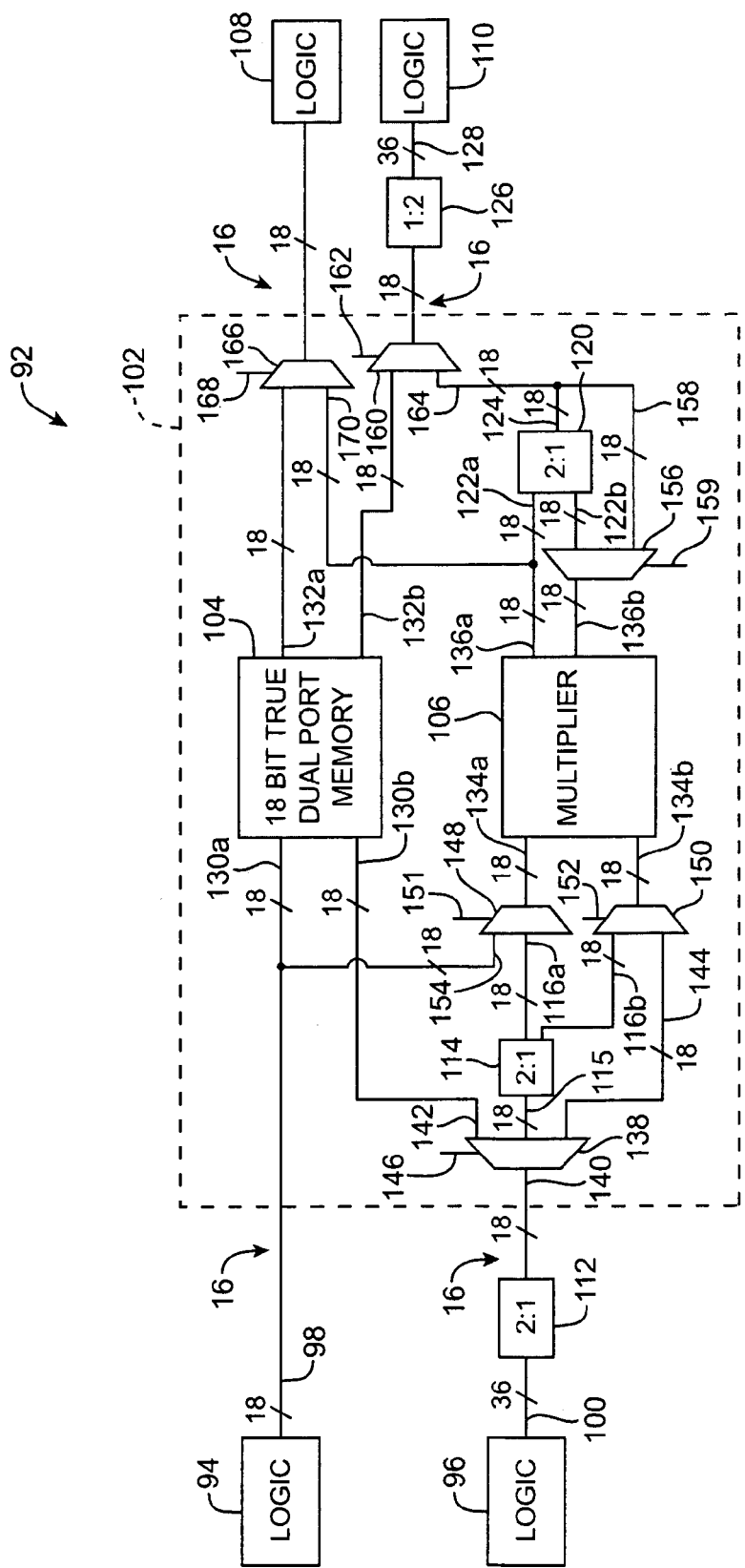
FIG. 6 is a circuit diagram showing how two dedicated circuits such as a true dual-port memory and an 18-bit×18-bit multiplier can share interconnect resources on an integrated circuit such as a programmable logic device in accordance with the present invention.

Circuitry 92 on an illustrative integrated circuit in which multiple circuits share interconnect resources is shown in FIG. 6. The integrated circuit of which circuitry 92 is a part may be any suitable integrated circuit such as a programmable logic device integrated circuit, a microprocessor, a digital signal processor, a memory-based device, an application-specific integrated circuit (ASIC), etc. Circuitry 92 may be controlled by static and/or dynamic control signals. In one suitable arrangement, circuitry 92 is part of a programmable logic device and control signals for controlling the allocation of resources and other configurable settings within circuitry 92 are provided in the form of static control signals from programmable elements such as programmable elements 20 of FIG. 1.

As shown in FIG. 6, data may be generated by circuits such as logic 94 and logic 96. Circuits 94 and 96 may be any suitable circuitry that generates data signals (e.g., a digital circuit that generates digital signals). As an example, circuits 94 and 96 may be programmable logic circuits (e.g., part of programmable logic 18) that a user has customized using configuration data applied by programmable elements (e.g., elements 20 of FIG. 1). In a programmable logic device of the type shown in FIG. 2, logic 94 and 96 may be formed from the programmable regions 24 and 22.

Logic circuits such as circuits 94 and 96 may generate any suitable number of data signals. In the example of FIG. 6, logic 94 generates 18 data signals on 18 parallel data lines 98 (e.g., as 18-bit digital words) and logic 96 generates data on up to 36 data lines 100 (e.g., as two 18-bit words). The numbers of lines in the various signal conductor structures shown in FIG. 6 are merely illustrative. Any suitable numbers of data conductors may be used if desired.

The circuitry within the dashed box 102 of FIG. 6 includes (in this example) a memory circuit 104 and a multiplier 106. These are dedicated hardwired circuits with either no capacity for reconfiguration or only modest reconfiguration capabilities. As an example, multiplier 106 may be permanently fixed in an 18-bit×18-bit configuration or may have the limited capability to be reconfigured as desired by a user to operate as either an 18-bit×18 bit multiplier or multiple 9-bit×9-bit multipliers. Regardless of whether circuits such as multiplier 106 and memory 104 are capable of such modest reconfiguration, these circuits are dedicated to their intended function (e.g., data storage, multiplication or other digital signal processing tasks, etc.). These circuits are therefore considered to be hardwired circuits and not programmable logic such as programmable logic 18 of FIG. 1.

The circuitry of dashed box 102 is generally located in a localized area of the integrated circuit (i.e., only short local conductors and no long interconnects 16 are used within box 102). The circuitry of dashed box 102 may be used on a programmable logic device of the type shown in FIG. 2. In this situation, the multiplier 106 and memory 104 of FIG. 6 may be located adjacent to each other, as shown by the digital signal processor circuitry 26 and memory 28 of FIG. 2.

As shown in FIG. 6, interconnects 16 are used to convey signals to the circuitry of box 102 from logic 94 and 96 and are used to convey signals from the circuitry of box 102 to circuitry such as logic circuitry 108 and 110. Logic circuitry 108 and 110 may be any suitable digital circuitry such as programmable logic circuitry on a programmable logic device.

In some situations, parallel-to-serial converters and serial-to-parallel converter circuitry may be used to compress and decompress data. For example, 2:1 parallel-to-serial converter 112 can be used to compress data (using time-division multiplexing), so that the data on the 36 output lines 100 from logic 96 can be conveyed to circuitry 102 over only 18 interconnect lines 16. At dedicated circuitry 102, a corresponding 1:2 serial-to-parallel converter 114 may be used to deserialize the incoming data. Time-division demultiplexing is used so that the data signals on 18 input lines 115 can be placed on 36 corresponding lines (18 lines 116a and 18 lines 116b).

In certain circumstances, time-division multiplexing and demultiplexing may also be used on the output side of hardwired circuitry 102. For example, 2:1 parallel-to-serial converter 120 may be used to map 36 input lines (18 lines 122a and 18 lines 122b) to a corresponding set of 18 lines 124, which are coupled to 18 associated interconnect lines 16. After being transported across the integrated circuit, the signals on these 18 interconnects 16 may be received by a serial-to-parallel converter 126 in the vicinity of logic 110. Serial-to-parallel converter 126 may use time-division demultiplexing techniques to convert the 18 lines of compressed data from interconnects 16 to 36 corresponding data lines 128. Lines 128 are connected to logic 110.

Circuitry 92 includes switching circuitry that can be configured to selectively steer data signals through the memory 104, the multiplier 106, or both the memory and multiplier. A user (e.g., a logic designer) may configure circuitry 92 as desired to optimize a desired logic design. If the functions of a true dual-port memory are desired, the multiplication capabilities of multiplier 106 may be sacrificed and all data from circuits 94 and 96 and all of the data to circuits 108 and 110 may be routed through input ports 130a and 130b and output ports 132a and 132b of memory 104. If the functions of a full-speed multiplier are desired (i.e., a multiplier operating at $f_{INTERCONNECT}$ rather than $f_{INTERCONNECT}/2$), the storage capabilities of memory 104 may be sacrificed and data from logic 94 and logic 96 and data to logic 108 and logic 110 may be routed through input ports 134a and 134b and output ports 136a and 136b of multiplier 106.

Both memory functions and multiplier functions may be provided simultaneously by routing signals from logic 94 to logic 108 through memory 104 and by routing signals from logic 96 to logic 110 through multiplier 106. In this configuration, both the memory 104 and multiplier 106 function in a somewhat reduced capacity. Memory 104 serves as a simple dual port memory rather than a true dual port memory and multiplier 106 operates at half its maximum potential speed (i.e., at $f_{INTERCONNECT}/2$). Nevertheless, this configuration allows use of data compression and decompression, which minimizes interconnect resource consumption.

Any suitable switching circuitry arrangement may be used to route signals through the appropriate portions of the hardwired circuitry 104 and 106. With one suitable arrangement, switching circuitry is provided in the form of multiplexer circuits (sometimes called multiplexers and demultiplexers or switching circuits) that are based on transistors controlled by configuration bits. If desired, switching circuitry may be used that is controlled by dynamic control signals.

In the illustrative configuration of FIG. 6, multiplexer circuit 138 directs the signals on its 18 inputs 140 to 18 corresponding outputs selected from (1) 18 outputs 142, (2) 18 outputs 115, and (3) 18 outputs 144. Multiplexer 138 may be controlled by static or dynamic control signals applied to control input 146.

Multiplexers 148 and 150 may be controlled by static or dynamic control signals applied respectively to control inputs 151 and 152. Multiplexer 148 may be configured to either connect its 18 inputs 154 (which are connected to 18 corresponding interconnects 16 from logic 94) or its 18 inputs 116a to its 18 outputs at port 134a of multiplier 106. Multiplexer 150 may be configured to either connect its 18 inputs at lines 116b or its 18 inputs at output lines 144 from multiplexer 138 to its 18 multiplexer outputs at input port lines 134b of multiplier 106.

Multiplexer 156 has its input connected to 18 signal lines at output port 136b of multiplier 106. Multiplexer 156 can be configured to connect its 18 input lines to 18 lines 122b at one of the 18-line inputs to parallel-to-serial converter 120. Alternatively, multiplexer 156 can be configured to connect its 18 input lines to 18 bypass lines 158, so that the data from output port 136b of multiplier 106 bypasses parallel-to-serial converter 120. Multiplexer 156 may be controlled by static or dynamic control signals applied to control input 159.

Multiplexer 160 may be controlled by static or dynamic control signals applied to control input 162. Multiplexer 160 may connect either the 18 data lines from port 132b of memory 104 or the 18 data lines 164 at its inputs to 18 corresponding interconnect lines 16 at its output.

Multiplexer 166 may be controlled by static or dynamic control signals applied to control input 168. Either the 18 data lines connected to output port 132a of memory 104 or the 18 data lines 170 may be connected to the 18 interconnect lines 16 at the output of multiplexer 166.

With one illustrative arrangement, the circuitry of serial-to-parallel converter 114 and parallel-to-serial converter 120 is hardwired. The circuitry of parallel-to-serial converter 112 and serial-to-parallel converter 126 may be either hardwired or formed from programmable logic (e.g., when circuitry 92 is part of a programmable logic device).

If converters 112 and 126 are formed from hardwired circuitry, bypass multiplexers may be used to bypass this circuitry when it is not used.

If converters 112 and 126 are to be constructed from programmable logic, user-created configuration data can be used to dictate whether or not the converters 112 and 126 are implemented on a given device. When converters 112 and 126 are needed, configuration data may be generated that forms the converters 112 and 126 from programmable logic. When converters 112 and 126 are not needed, configuration data may be generated that does not form converters 112 and 126. Because the programmable logic that would otherwise be used to form converters 112 and 126 is available to implement additional logic functions in this situation, programmable logic resources are not wasted.

In the arrangement of FIG. 6, certain interconnects 16 (e.g., the upper interconnects in FIG. 6) are normally associated with one hardwired circuit (e.g., memory 104) and the other interconnects 16 (e.g., the lower interconnects in FIG. 6) are normally associated with another hardwired circuit (e.g., multiplier 106). When it is desired to use a particular hardwired circuit to its fullest potential, the other hardwired circuit can be sacrificed and interconnect resources can be borrowed from that other hardwired circuit. Because it is not always necessary to use both hardwired circuits, the ability to share interconnect resources in this way is generally more efficient than arrangements in which large numbers of interconnects are associated with each hardwired circuit.

The circuitry 92 of FIG. 6 can operate in three modes. In each mode, different static and/or dynamic control signals are used to configure the circuitry 92 appropriately. The control signals may be, for example, signals associated with configuration data produced by a logic designer using appropriate programmable logic device design and programming tools.

In its first mode of operation ("mode 1"), the functions of the multiplier 106 are not used. The parallel-to-serial and serial-to-parallel capabilities of converters 112 and 126 are also not needed, and the programmable logic that might otherwise be used to implement converters 112 and 126 may be used for implementing other desired logic. In this configuration, 18 of the data outputs 100 from logic 96 are connected directly to 18 corresponding interconnects 16 without need to pass through a parallel-to-serial converter and 18 interconnects 16 are connected directly to 18 inputs of logic 110 without need to pass through a serial-to-parallel converter.

The 18 interconnects 16 from logic 96 are directed to the input port 130b of memory 104 via multiplexer 138. The other input port of memory 104 (port 130a) receives data from 18 interconnects 16. The data received at ports 130a and 130b may be provided at the maximum frequency allowed by the interconnects (i.e., $f_{INTERCONNECT}$). The two 18-bit output ports 132a and 132b of memory 104 provide corresponding output data. The data from 18-bit output port 132a is directed to logic 108 via multiplexer 166 and associated interconnects 16. The data from 18-bit output port 132b is directed to logic 110 via multiplexer 160 and associated interconnects 16. Serial-to-parallel converter 126 is not present in mode 1.

In mode 1, the memory 104 functions as a true dual-port memory with two 18-bit input ports 130a and 130b and two 18-bit output ports 132a and 132b. Two 18-bit data words can be simultaneously written into or read out of memory 104, or an 18-bit data word can be written via one port while another port of memory 104 is used to simultaneously read an 18-bit data word. The full bandwidth of the interconnects 16 (e.g., $f_{INTERCONNECT}$) may be used for input ports 130a and 130b and for output ports 132a and 132b.

In its second mode of operation ("mode 2"), the functions of both the memory 104 and the multiplier 106 are used. The switching circuitry is configured so that a portion of the data handled by circuitry 92 is routed through memory 104 and a portion of the data handled by circuitry 92 is routed through multiplier 106. The data signals from logic 94 are provided to port 130a of memory 104 via 18 interconnect lines. These lines may operate at full speed (i.e., $f_{INTERCONNECT}$), but because only one set of 18 interconnect lines 16 is connected to memory 104, memory 104 functions as a simple dual-port memory (with active ports 130a and 132a) rather than as a true dual-port memory.

Logic 96 can supply 36 bits of data in mode 2, at a data rate of $f_{INTERCONNECT}/2$. Some of the programmable logic in circuitry 92 is configured to form parallel-to-serial converter 112 and serial-to-parallel converter 126. The data on the 36 lines from logic 96 is converted to data on 18 lines of interconnect 16 by converter 112. Because of the time-division-multiplexing operation of converter 112, the data on the 18 lines of interconnects 16 at the output of converter 112 has an associated data rate of $f_{INTERCONNECT}$. Because of the use of converter 112 (and corresponding converter 114), the number of interconnect lines between logic 96 and multiplier 106 can be reduced from 36 to 18, thereby conserving interconnect resources.

When the 18 parallel signals from converter 112 are received at circuitry 102, multiplexer 138 directs these signals to serial-to-parallel converter 114. Serial-to-parallel converter 114 decompresses the compressed data to produce 36 corresponding output data signals operating at $f_{INTERCONNECT}/2$. Half of the 36 signals produced by converter 114 are provided to multiplier input port 134a by multiplexer 148. The other half of the 36 signals produced by converter 114 are provided to multiplier input port 134b by multiplexer 150.

During operation in mode 2, the multiplier 106 multiplies the 18-bit data words at input 134a by the 18-bit data words at input 134b. (If desired, multiplier 106 can also be operated in other configurations—e.g., for 9-bit multiplication, etc.) The resulting output is provided at outputs 136a and 136b. Multiplexer 156 is configured to pass the signals from output 136b to the input 122b of parallel-to-serial converter 120. The output signals from output 136a are provided to input 122a of parallel-to-serial converter 120.

The parallel-to-serial converter 120 takes the 36 input signals on inputs 122a and 122b (operating at $f_{INTERCONNECT}/2$) and uses time-division-multiplexing to produce 18 corresponding data signals at output 124 (operating at $f_{INTERCONNECT}$). The 18 output signals from converter 120 are passed to 18 corresponding interconnect lines 16 via multiplexer 160. These signals may then be passed to logic 110. At logic 110, the 18 parallel interconnect signals are decompressed by converter 126 to form 36 signals on line 128.

In mode 2, the memory 104 and the multiplier 106 each operate with a somewhat reduced capacity. Memory 104 is configured as a simple dual-port memory rather than a true dual-port memory and multiplier 106 operates at $f_{INTERCONNECT}/2$, rather than at the maximum rate permitted by the interconnect technology used on the integrated circuit ($f_{INTERCONNECT}$). However, during mode 2 operation, the data compression and data decompression process can be used to reduce the amount of interconnect resources consumed in conveying signals between the programmable logic and the hardwired circuitry.

In its third mode of operation ("mode 3"), the functions of the memory 104 are not used. The parallel-to-serial and serial-to-parallel capabilities of converters 112 and 126 are not needed, so the programmable logic that might otherwise be used to implement converters 112 and 126 may be used for implementing other desired logic.

In mode 3, the full capabilities of multiplier 106 can be used. Two 18-bit words can be multiplied to produce a corresponding 36-bit output. The first data word may be received from the 18 interconnects 16 connected to input 154 of multiplexer 148. These interconnects 16 are supplied with an 18-bit data signal from logic 94. The first data word may be provided to multiplier 106 at input port 134a via multiplexer 148. The second data word may be provided by 18 data lines connected to logic 96. A set of 18 interconnects 16 may be used to route the second data word from logic 96 to input 140 of multiplexer 138. The parallel-to-serial converter 112 is not needed in this configuration. The multiplexer 138 is configured to route the second data word to multiplexer 150 via 18 lines 144. Multiplexer 150 is configured to route the second data word to input port 134b.

Because data compression is not used in mode 3, the 18 signals associated with the first data word and the 18 signals associated with the second data word can be provided to multiplier 106 at the maximum frequency supported by the interconnects ($f_{INTERCONNECT}$). As a result, the multiplier 106 can perform 18-bit×18-bit multiplication operations at this same maximum speed (i.e., at $f_{INTERCONNECT}$). Because it is not necessary to reduce the operating frequency of multiplier 106 during mode 3, the 36-bit result of the 18-bit×18-bit multiplication operations performed by multiplier 106 can be provided across the 36-bits of output (port 136a and port 136b) from multiplier 106 at $f_{INTERCONNECT}$. One half of the 36-bit output from multiplier 106 may be routed to logic 108 via multiplexer 166 and 18 corresponding interconnects 16. The other half of the 36-bit output from multiplier 106 may be routed to logic 110 via multiplexer 156, bypass lines 158, multiplexer 160, and 18 associated interconnect lines 16. The 18 associated interconnect lines 16 can operate at $f_{INTERCONNECT}$ because the 1:2 serial-to-parallel converter 126 is not being used.

The foregoing is merely illustrative of the principles of this invention and various modifications can be made by those skilled in the art without departing from the scope and spirit of the invention.

What is claimed is:

1. An integrated circuit comprising:
   digital circuitry that generates data signals;
   parallel-to-serial converter circuitry that uses time-division multiplexing to compress the data signals;
   a plurality of interconnect lines that carry the compressed data signals;
   serial-to-parallel converter circuitry that receives the compressed data signals from the interconnect lines and that uses time-division demultiplexing to decompress the data signals; and
   dedicated hardwired circuitry that uses the decompressed data signals.

2. The integrated circuit defined in claim 1 wherein the interconnect lines include at least some global conductors that span the integrated circuit.

3. The integrated circuit defined in claim 1 wherein the dedicated hardwired circuitry comprises digital signal processing circuitry that processes the decompressed data signals to produce processed data signals.

4. The integrated circuit defined in claim 1 wherein the dedicated hardwired circuitry comprises a multiplier.

5. The integrated circuit defined in claim 1 further comprising programmable logic, wherein configuration data is used to form the parallel-to-serial converter circuitry from at least some of the programmable logic.

6. The integrated circuit defined in claim 1 wherein the dedicated hardwired circuitry comprises digital signal processing circuitry that processes the decompressed data signals to produce processed data signals, the integrated circuit further comprising:
additional parallel-to-serial converter circuitry that uses time-division multiplexing to compress the processed data signals;
additional interconnect lines that carry the compressed processed data signals;
additional serial-to-parallel converter circuitry that uses time-division demultiplexing to decompress the compressed processed data signals; and
additional digital circuitry that receives the decompressed data signals from the additional serial-to-parallel converter circuitry.

7. The integrated circuit defined in claim 1 wherein the dedicated hardwired circuitry comprises a multiplier, the integrated circuit further comprising:
a memory circuit adjacent to the multiplier; and
switching circuitry that is selectively configured to steer signals through one of: (1) the memory circuit, (2) the memory circuit and the multiplier, and (3) the multiplier.

8. A programmable logic integrated circuit comprising:
a region of programmable logic that produces data signals;
a parallel-to-serial converter formed from configured programmable logic that uses time-division multiplexing to compress the data signals;
interconnect resources including a plurality of interconnect lines that convey the compressed data signals; and
dedicated hardwired circuitry including a dedicated hardwired serial-to-parallel converter that receives the compressed data signals and that uses time-division demultiplexing to decompress the data signals.

9. The programmable logic device integrated circuit defined in claim 8 wherein the dedicated hardwired circuitry comprises digital signal processing circuitry that processes the decompressed data signals.

10. The programmable logic device integrated circuit defined in claim 8 wherein the dedicated hardwired circuitry comprises a memory circuit and digital signal processing circuitry.

11. The programmable logic device integrated circuit defined in claim 8 wherein the dedicated hardwired circuitry comprises a memory circuit and digital signal processing circuitry and wherein the interconnect resources comprise a first set of interconnects and a second set of interconnects, the first set of interconnects carrying uncompressed digital data to the memory circuit and the second set of interconnects carrying the compressed data signals to the dedicated hardwired serial-to-parallel converter.

12. A programmable logic device integrated circuit comprising:
a first region of logic that produces first data signals;
a second region of logic that produces second data signals;
a first set of interconnect conductors that carry the first data signals;
a second set of interconnect conductors that carry the second data signals;
a first dedicated hardwired circuit;
a second dedicated hardwired circuit;
a serial-to-parallel converter circuit that uses time-division demultiplexing to decompress data;
programmable logic that can be selectively configured to form a programmable logic parallel-to-serial converter; and
configurable switching circuitry, wherein the programmable logic and configurable switching circuitry are selectively configured using configuration data to support three modes of operation including:
a first mode of operation in which the first data signals and second data signals are routed to the first dedicated hardwired circuit and are not used by the second dedicated hardwired circuit;
a second mode of operation in which the first data signals are routed to the first dedicated hardwired circuit and in which the second data signals are routed to the second dedicated hardwired circuit through the programmable logic parallel-to-serial converter and the serial-to-parallel converter circuit; and
a third mode of operation in which the first data signals and second data signals are routed to the second dedicated hardwired circuit and are not used by the first dedicated hardwired circuit.

13. The programmable logic device integrated circuit defined in claim 12 wherein the first dedicated hardwired circuit comprises a memory.

14. The programmable logic device integrated circuit defined in claim 12 wherein the second dedicated hardwired circuit comprises a digital signal processing circuit.

15. The programmable logic device integrated circuit defined in claim 12 wherein the first dedicated hardwired circuit comprises a memory and wherein the second dedicated hardwired circuit comprises a multiplier.

16. The programmable logic device integrated circuit defined in claim 12 wherein the first dedicated hardwired circuit comprises a memory that is configurable to function as a true dual-port memory in the first mode of operation and to function as a simple dual-port memory in the second mode of operation.

17. The programmable logic device integrated circuit defined in claim 12 wherein the second dedicated hardwired circuit comprises a multiplier that is configurable to operate at a frequency of f in the second mode of operation and a frequency greater than f in the third mode of operation.

18. The programmable logic device integrated circuit defined in claim 12 wherein the second dedicated hardwired circuit comprises a multiplier that is configurable to operate at a frequency of f in the second mode of operation and a frequency of two times f in the third mode of operation, wherein the programmable logic parallel-to-serial converter circuit has N inputs and N/2 outputs coupled to the second set of interconnect conductors.

19. The programmable logic device integrated circuit defined in claim 12 further comprising:
a third region of logic;

a fourth region of logic;

a hardwired parallel-to-serial converter that uses time-division multiplexing to compress data;

additional programmable logic that can be selectively configured to form a programmable logic serial-to-parallel converter; and additional interconnect resources that convey data signals from the first and second dedicated hardwired circuits to the third and fourth regions of logic, wherein at least in the second mode of operation the hardwired parallel-to-serial converter provides compressed data to the programmable logic serial-to-parallel converter over the additional interconnect resources and wherein the programmable logic serial-to-parallel converter decompresses this compressed data and provides this decompressed data to the fourth region of logic while the third region of logic receives data from the first dedicated hardwired circuit.

20. The programmable logic device integrated circuit defined in claim 12 wherein the serial-to-parallel converter comprises a dedicated hardwired serial-to-parallel converter, the programmable logic device further comprising:

a third region of logic;

a fourth region of logic;

a dedicated hardwired parallel-to-serial converter that uses time-division multiplexing to compress data from the second dedicated hardwired circuit;

additional programmable logic that can be selectively configured to form a programmable logic serial-to-parallel converter that decompresses the compressed data from the dedicated hardwired parallel-to-serial converter; and additional interconnect resources that convey data from the first and second dedicated hardwired circuits to the third and fourth regions of logic, wherein during at least one mode of operation the programmable logic serial-to-parallel converter provides data to the fourth logic region and wherein the first, second, third, and fourth regions of logic comprise programmable logic that is configured using configuration data.

* * * * *